(12) United States Patent
Choi et al.

(10) Patent No.: US 9,634,281 B2
(45) Date of Patent: Apr. 25, 2017

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-Do (KR)

(72) Inventors: Manseob Choi, Yongin (KR); Yoshii Katsumasa, Yongin (KR); Wongyun Kim, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/741,274

(22) Filed: Jun. 16, 2015

(65) Prior Publication Data

US 2016/0104857 A1   Apr. 14, 2016

(30) Foreign Application Priority Data

Oct. 8, 2014   (KR) .................. 10-2014-0135969

(51) Int. Cl.
H01L 51/52   (2006.01)

(52) U.S. Cl.
CPC ...... *H01L 51/5218* (2013.01); *H01L 51/5221* (2013.01); *H01L 51/5271* (2013.01); *H01L 51/5281* (2013.01)

(58) Field of Classification Search
CPC . H01L 51/5218; H01L 51/5215; H01L 51/56; H01L 51/5221; H01L 51/5281; H01L 51/0096; H01L 51/0067; H01L 51/0073
See application file for complete search history.

(56) References Cited

U.S. PATENT DOCUMENTS

| | | | |
|---|---|---|---|
| 2013/0181242 A1 | 7/2013 | Cho | |
| 2014/0061605 A1 | 3/2014 | Kim et al. | |
| 2014/0197390 A1* | 7/2014 | Stromer | H01L 51/5275 257/40 |

FOREIGN PATENT DOCUMENTS

| | | |
|---|---|---|
| KR | 10-2012-0038214 A | 4/2012 |
| KR | 10-2013-0084848 A | 7/2013 |
| KR | 10-2013-0108028 A | 10/2013 |
| KR | 10-2013-0129665 A | 11/2013 |
| KR | 10-2014-0030842 A | 3/2014 |

OTHER PUBLICATIONS

Sood et al., "Experimental and Theoretical Study of the Optical and Electrical Properties of Nanostructured Indium Tin Oxide Fabricated by Oblique-Angle Deposition", Journal of Nanoscience and Nanotechnology, 2012, vol. 12, pp. 3950-3953.

* cited by examiner

*Primary Examiner* — Mamadou Diallo
(74) *Attorney, Agent, or Firm* — Knobbe Martens Olson & Bear LLP

(57) ABSTRACT

Disclosed is an organic light-emitting display apparatus. The organic light-emitting display apparatus includes a substrate, a first reflective electrode that is disposed over the substrate, an organic layer that is disposed over the first reflective electrode, and includes a light emission layer, and a second reflective electrode that is disposed over the organic layer. At least one of the first and second reflective electrodes comprises a low refractive layer having a refractive index of about 1.4 or less which is smaller than that of the organic layer.

20 Claims, 14 Drawing Sheets

ORGANIC LIGHT-EMITTING DISPLAY APPARATUS AND METHOD OF MANUFACTURING THE SAME

RELATED APPLICATION

This application claims the benefit of Korean Patent Application No. 10-2014-0135969, filed on Oct. 8, 2014, in the Korean Intellectual Property Office, the disclosure of which is incorporated herein in its entirety by reference.

BACKGROUND

1. Field

One or more embodiments relate to an organic light-emitting display apparatus and a method of manufacturing the same.

2. Description of the Related Art

Organic light-emitting apparatuses are self-emitting display apparatuses that include a hole injection electrode, an electron injection electrode, and an emission layer formed therebetween, and in which holes injected from the hole injection electrode and electrons injected from the electron injection electrode are recombined and dissipated at the emission layer to emit light. The organic light-emitting display apparatuses show high-grade characteristics such as low power consumption, high luminance, and a high response time, and thus are attracting a lot of attention.

The organic light-emitting display apparatuses have multi-layer stacked structures, and are very high in a rate where light emitted from the emission layer is confined in a layer of an organic light-emitting display apparatus and is not emitted to the outside. In the organic light-emitting display apparatuses, light extraction efficiency is very low, and is known as about 20%. This is caused by a waveguide phenomenon based on total reflection. Therefore, it is very important to increase a light extraction efficiency of the organic light-emitting display apparatuses.

SUMMARY

One or more embodiments include an organic light-emitting display apparatus and a method of manufacturing the same for enhancing light extraction efficiency.

Additional aspects will be set forth in part in the description which follows and, in part, will be apparent from the description, or may be learned by practice of the presented embodiments.

One aspect of the invention provides an organic light-emitting display apparatus comprising: a substrate; a first reflective electrode disposed over the substrate; an organic layer disposed over the first reflective electrode, and comprising a light emission layer; and a second reflective electrode disposed over the organic layer, wherein at least one of the first and second reflective electrodes comprises a low refractive layer having a refractive index of about 1.4 or less.

In the foregoing apparatus, the first reflective electrode may comprise: a transparent electrode layer contacting the organic layer and being substantially transparent; and a reflective layer configured to reflect light emitted from the organic layer, wherein the transparent electrode layer is interposed between the organic layer and the reflective layer. The first reflective electrode may comprise: the low refractive layer being substantially transparent and contacting the organic layer; and a reflective layer configured to reflect light emitted from the organic layer and contacting the low refractive layer, wherein the low refractive layer is interposed between the organic layer and the reflective layer. The low refractive layer may be an indium tin oxide (ITO) layer having a refractive index of about 1.2 or less. The low refractive layer may be disposed between the transparent electrode layer and the reflective layer. The low refractive layer may be a $SiO_2$ layer having a refractive index of about 1.4 or less. The transparent electrode layer may have a refractive index substantially greater than that of the low refractive layer.

Still in the foregoing apparatus, the organic light-emitting display apparatus may further comprise a spacer disposed at a boundary of the first reflective electrode, and protruding in a direction away from the substrate. The spacer may comprise: a first spacer portion formed to cover the boundary of the first reflective electrode; and a second spacer portion formed on the first spacer. The apparatus may further comprise a spacer disposed over the substrate and next to the organic layer when viewed in a viewing direction perpendicular to a major surface of the substrate, wherein the spacer overlaps a boundary of the first reflective electrode when viewed in the viewing direction.

Yet in the foregoing apparatus, the second reflective electrode may comprise: a first reflective surface configured to reflect light emitted from the organic layer toward the first reflective electrode; and a second reflective surface disposed next to the first reflective surface when viewed in a viewing direction perpendicular to a major surface of the substrate, and configured to reflect the light emitted from the organic layer toward the substrate. The second reflective surface may overlap a boundary of the first reflective electrode when viewed in the viewing direction, and has an arc shape in a section perpendicular to the major surface of the substrate. The apparatus may further comprise an insulating layer disposed between the substrate and the first reflective electrode.

Further in the foregoing apparatus, the substrate may be substantially transparent. The apparatus may further comprise a light blocking layer disposed between the substrate and the first reflective electrode and overlapping the first reflective electrode when viewed in a viewing direction perpendicular to a major surface of the substrate. The at least one of the first and second reflective electrodes may further comprise a reflective layer, wherein the low refractive layer is interposed between the organic layer and the reflective layer, wherein the organic layer has a refractive index substantially greater than that of the low refractive layer.

Another aspect of the invention provides a method of making an organic light-emitting display apparatus, the method comprising: forming a first reflective electrode over a substrate; forming an organic layer comprising a light emission layer over the first reflective electrode; and forming a second reflective electrode over the organic layer, wherein at least one of the first reflective electrode and the second reflective electrode comprises a low refractive layer having a refractive index of about 1.4 or less.

In the foregoing method, the first reflective electrode may comprise: a reflective layer formed over the substrate; and the low refractive layer being substantially transparent, disposed between the reflective layer and the organic layer and having a refractive index of about 1.2 or less. The first reflective electrode may comprise: a reflective layer; the low refractive layer; and a transparent electrode layer disposed between the organic layer and the low refractive layer. The organic layer may have a refractive index substantially greater than that of the low refractive layer.

According to one or more embodiments, an organic light-emitting display apparatus includes: a substrate; a first reflective electrode that is disposed on the substrate; an organic layer that is disposed on the first reflective electrode, and includes an emission layer; and a second reflective electrode that is disposed on the organic layer, wherein at least one of the first and second reflective electrodes includes a low refractive layer having a refractive index of 1.4 or less.

The first reflective electrode may include: a transparent electrode layer that contacts the organic layer; and a reflective layer that is disposed under the transparent electrode layer.

The transparent electrode layer may be a low refractive layer having a refractive index of 1.4 or less.

The low refractive layer may be an indium tin oxide (ITO) layer having a refractive index of 1.2 or less.

The low refractive layer may be disposed between the transparent electrode layer and the reflective layer.

The low refractive layer may be a $SiO_2$ layer having a refractive index of 1.4 or less.

The organic light-emitting display apparatus may further include a spacer that is disposed at an end of the first reflective electrode, and protrudes in a direction away from the substrate.

The spacer may include: a first spacer that is formed to cover the end of the first reflective electrode; and a second spacer that is formed on the first spacer.

The second reflective electrode may include: a first reflective surface that reflects light, emitted from the organic layer, toward the first reflective electrode; and a second reflective surface that reflects the light, emitted from the organic layer, toward the substrate.

The second reflective surface may be disposed at an end of the first reflective electrode, and has an arc shape surrounding the end of the first reflective electrode.

The organic light-emitting display apparatus may further include an insulating layer that is disposed between the substrate and the first reflective electrode.

The substrate may be a transparent substrate.

The organic light-emitting display apparatus may further include a light blocking layer that is disposed between the substrate and the first reflective electrode.

According to one or more embodiments, a method of forming an organic light-emitting display apparatus includes: forming a first reflective electrode on a substrate; forming an organic layer, including an emission layer, on the first reflective electrode; and forming a second reflective electrode on the organic layer, wherein at least one of the forming of the first reflective electrode and the forming of the second reflective electrode includes forming a low refractive layer having a refractive index of 1.4 or less.

The forming of the first reflective electrode may include: forming a reflective layer on the substrate; and forming a transparent electrode layer, having a refractive index of 1.2 or less, on the reflective layer, and the transparent electrode layer is the low refractive layer.

The forming of the first reflective electrode may include: forming a reflective layer on the substrate; forming the low refractive layer having a refractive index of 1.4 or less on the reflective layer; and forming a transparent electrode layer on the low refractive layer.

In addition to the aforesaid details, other aspects, features, and advantages will be clarified from the following drawings, claims, and detailed description.

These general and specific embodiments may be implemented by using a system, a method, a computer program, or a combination of the system, the method, and the computer program.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
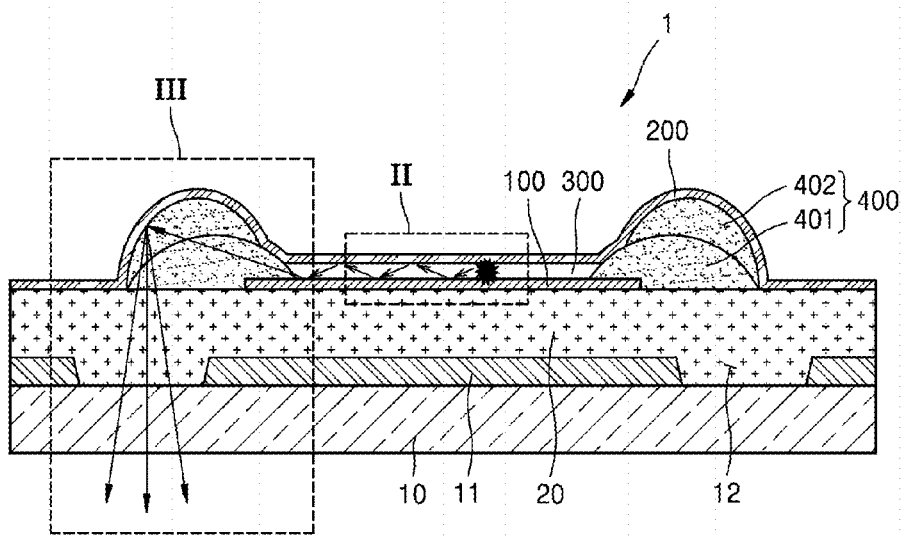
FIG. 1 is a schematic, cross-sectional view of an organic light-emitting display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein.

Embodiments of the inventive concept may impose various transformations that may have various embodiments, and specific embodiments illustrated in the drawings will be described in detail in the detailed description. The effects and features of the inventive concept will become apparent from the following description of the embodiments with reference to the accompanying drawings, which is set forth hereinafter. The inventive concept may, however, be embodied in different forms and should not be construed as being limited to the embodiments set forth herein.

Hereinafter, embodiments of the inventive concept will be described in detail with reference to the accompanying drawings. In addition, in the present specification and drawings, like reference numerals refer to like elements throughout, and thus, redundant descriptions are omitted.

In the following embodiments, the terms "first" and "second" are for differentiating one element from another element, and these elements should not be limited by these terms.

In the following embodiments, the singular forms "a", "an" and "the" are intended to include the plural forms as well, unless the context clearly indicates otherwise.

In the following embodiments, it should be further understood that the terms "comprises", "comprising", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof.

In the following embodiments, when an element such as a layer or a region is referred to as being "on" another element, this includes a case where one element is disposed between other elements, in addition to a case where one element is disposed directly on the other element.

In the drawings, the dimensions of layers and regions are exaggerated or reduced for clarity of illustration. For example, a dimension and thickness of each element in the drawings are arbitrarily illustrated for clarity, and thus, embodiments of the inventive concept are not limited thereto.

FIG. 1 is a schematic cross-sectional view of an organic light-emitting display apparatus 1 according to an embodiment. Referring to FIG. 1, the organic light-emitting display apparatus 1 according to an embodiment includes a substrate 10 and an array of pixels. For each pixel, the apparatus further includes an insulating layer 20 disposed on the substrate 10, a first reflective electrode 100 disposed on the insulating layer 20, an organic layer 300 disposed on the first reflective electrode 100, and a second reflective electrode 200 disposed on the organic layer 300.

The substrate 10 may be a transparent substrate through which light passes. For example, the substrate 10 may be a glass substrate, a quartz substrate, or a transparent resin substrate. The transparent resin substrate used as the substrate 10 may include a polyimide resin, an acryl resin, a polyacrylate resin, a polycarbonate resin, a polyether resin, a polyethylene terephthalate resin, or a sulfonic acid resin.

A light blocking layer 11 may be disposed on the substrate 10. Thus, light is selectively transmitted through portions which are not blocked by the light blocking layer 11, thereby enhancing a contrast of the organic light-emitting display apparatus 1. The light blocking layer 11 may use a layer which absorbs light, for example, a black matrix layer.

The insulating layer 20 may be disposed on the substrate 10 to cover the light blocking layer 11. The insulating layer 20 may be formed in a single structure, but is not limited thereto. For example, the insulating layer 20 may be formed in a multi-layer structure having two or more layers.

For example, the insulating layer 20 may include an organic material. In embodiments, the insulating layer 20 may include a material selected from among photoresist, an acryl-based polymer, a polyimide-based polymer, a polyamide-based polymer, a siloxane-based polymer, a polymer containing a photosensitivity acryl carboxyl group, a novolac resin, and an alkali soluble resin. The materials may be used as a single, or used in combination.

As another example, the insulating layer 20 may include an inorganic material. For example, the insulating layer 20 may include a silicon compound, metal, and metal oxide. The insulating layer 20 may include a material selected from among silicon oxide (SiOx), silicon nitride (SiNx), silicon oxynitride (SiOxNx), silicon oxycarbide (SiOxCy), silicon carbonitride (SiCxNy), aluminum (Al), magnesium (Mg), zinc (Zn), hafnium (Hf), zirconium (Zr), titanium (Ti), tantalum (Ta), aluminum oxide (AlOx), titanium oxide (TiOx), tantalum oxide (TaOx), magnesium oxide (MgOx), zinc oxide (ZnOx), hafnium oxide (HfOx), zirconium oxide (ZrOx), and titanium oxide (TiOx). The materials may be used as a single, or used in combination.

In embodiments, a structure including a switching device, a line, and a circuit may be disposed on the substrate 10. In this case, the insulating layer 20 may have a sufficient thickness for covering a plurality of structures.

The first reflective electrode 100 may be disposed on the substrate 10. For example, the first reflective electrode 100 may be disposed on the insulating layer 20 disposed on the substrate 10.

The first reflective electrode 100 electrically contacts the organic layer 300, and reflects light emitted from the organic layer 300. In embodiments, the first reflective electrode 100 may be electrically connected to the switching device.

The first reflective electrode 100 may include a material suitable for performing a function of a reflective plate. For example, the first reflective electrode 100 may include a material selected from among metals, such as aluminum (Al), silver (Ag), platinum (Pt), gold (Au), chromium (Cr), tungsten (W), molybdenum (Mo), titanium (Ti), palladium (Pd), and iridium (Ir), and an alloy thereof. The first reflective electrode 100 may include a single-layer structure or a multi-layer structure including the above-described metals and/or alloy. A detailed structure of the first reflective electrode 100 will be described below.

A spacer 400, which protrudes in a direction away from the substrate 10, may be disposed at both ends of the first reflective electrode 100 in a section as shown in FIG. 1. The spacer 400 may be formed to cover an end of the first reflective electrode 100. In embodiments, when viewed in a viewing direction perpendicular to a major surface of the substrate, the spacer 400 may be formed to surround the first reflective electrode 100 and the organic layer 300.

In embodiments, the spacer 400 may have a light transmittance of 95% or more. Therefore, a loss of light is reduced in a process where light passes through the spacer 400.

The spacer 400 may be formed of an organic material. For example, the spacer 400 may include a material selected from photoresist, a polyacryl-based resin, a polyimide-based resin, and an acryl-based resin. However, a material of the spacer 400 is not limited thereto, and the spacer 400 may include an inorganic material, for example, a silicon compound.

The spacer 400 may be formed in a two-step structure. For example, the spacer 400 may include a first spacer portion 401, which is formed to cover the end of the first reflective electrode 100, and a second spacer portion 402 which is formed on the first spacer portion 401.

The organic layer 300 may be formed on the first reflective electrode 100. The organic layer 300 is formed between the two neighboring spacers 400 in a section view as shown in FIG. 1.

The organic layer 300 may include a light emission layer having at least one or more layers. The emission layer may be formed of, for example, various fluorescent or phosphor materials known to one of ordinary skill in the art.

The organic layer 300 may be formed in various structures which include the emission layer and further include various functional layers known to one of ordinary skill in the art. Examples of layers included in the organic layer 300 may include an electron injection layer, a hole blocking layer, an electron transport layer, a hole transport layer, and a hole injection layer.

The second reflective electrode 200 may be disposed on the organic layer 300 and the spacer 400. The second reflective electrode 200 may include a material selected from among metals, such as aluminum (Al), silver (Ag), platinum (Pt), gold (Au), chromium (Cr), tungsten (W), molybdenum (Mo), titanium (Ti), palladium (Pd), and iridium (Ir), and an alloy thereof.

Figure 2:
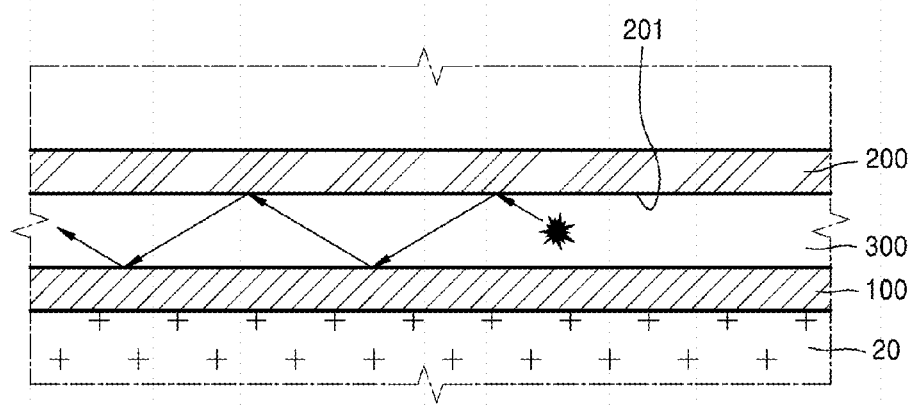
FIG. 2 is an enlarged diagram of a portion II of FIG. 1.
Figure 3:
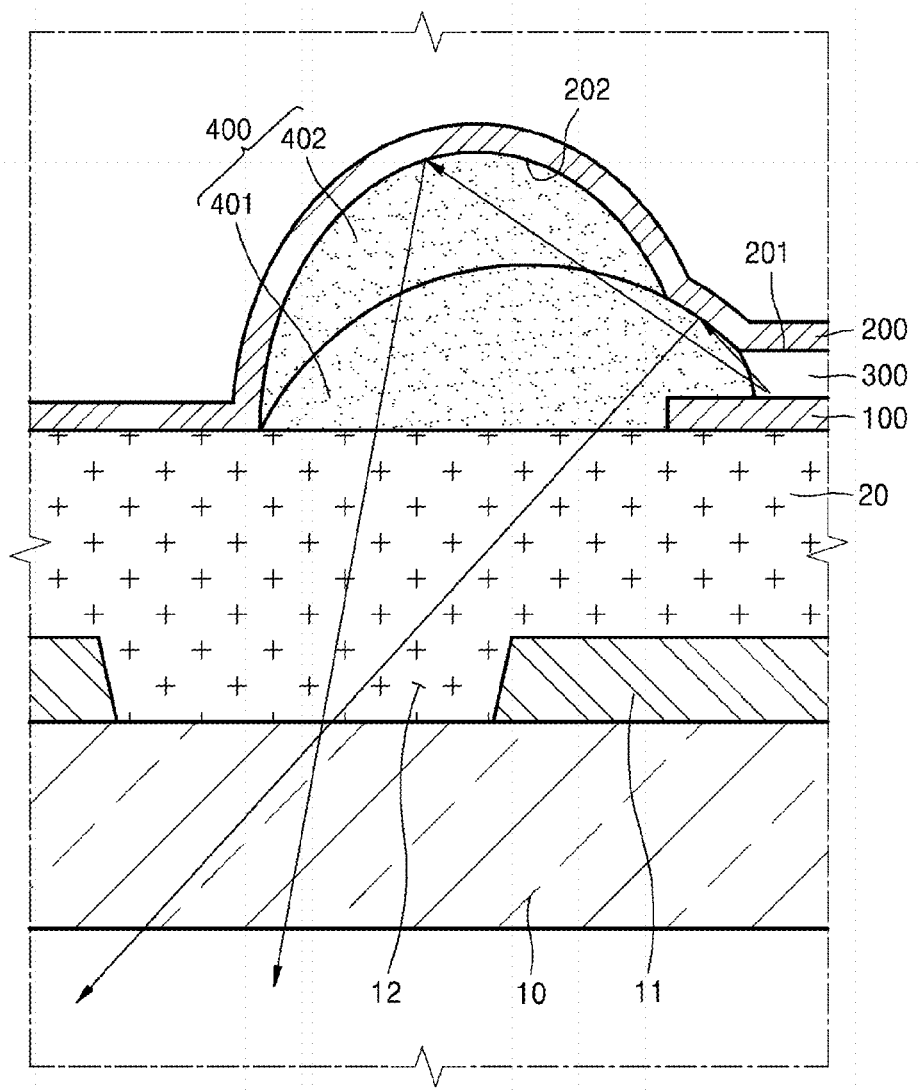
FIG. 3 is an enlarged diagram of a portion III of FIG. 1.

FIG. 2 is an enlarged diagram of a portion II of FIG. 1. FIG. 3 is an enlarged diagram of a portion III of FIG. 1. Referring to FIGS. 2 and 3, an emission structure of the organic light-emitting display apparatus 1 according to an embodiment of the present invention will be described in detail.

Referring to FIG. 2, light is emitted from the organic layer 300 disposed between the first reflective electrode 100 and the second reflective electrode 200. The light emitted from the organic layer 300 moves toward the second reflective electrode 200, and is reflected by the second reflective electrode 200. Subsequently, the light is repeatedly reflected by the first reflective electrode 100 and the second reflective electrode 200, and moves to a side of the pixel.

Referring to FIG. 3, the light moving to the side passes through the spacer 400, and is reflected by the second reflective electrode 200. The reflected light is extracted to the outside through an opening 12.

The second reflective electrode 200 is formed on the organic layer 300 and the spacer 400. The second reflective electrode 200 includes a first reflective surface 201, which is disposed on the organic layer 300 and reflects light toward the first reflective electrode 100, and a second reflective surface 202 which is disposed on the spacer 400 and reflects the light toward the substrate 10.

The second reflective electrode 200 formed on the spacer 400 has a shape corresponding to a shape of the spacer 400. The second reflective surface 202 may include a reflective surface corresponding to a surface shape of the spacer 400.

The spacer 400 may have a certain shape and thickness so that the light transmitted from the organic element is reflected by the second reflective electrode 200 toward the substrate 10. For example, the spacer 400 may wholly have an arc shape in a section as shown in FIG. 1, and have a thickness equal to or greater than a certain thickness.

The spacer 400 may have a shape of a two-step structure in which two arcs overlap each other. For example, the spacer 400 may include the first spacer portion 401, which is formed to cover the end of the first reflective electrode 100 and has an arc shape, and the second spacer portion 402 which is formed on the first spacer portion 401 and has an arc shape. Therefore, the second reflective surface 202 of the second reflective electrode 200 formed on the spacer 400 may have an arc shape which surrounds the end of the first reflective electrode 100. The second reflective surface 202 may have an arc shape, corresponding to a portion of the first spacer portion 401, and a two-step structure which includes an arc shape corresponding to the second spacer portion 402. Light extraction efficiency based on the opening 12 is more enhanced by the second reflective surface 202 having the two-step structure.

The spacer 400 may have a thickness of about 250 nm or more. For example, the spacer 400 may have a thickness of about 1,500 nm or more. For example, the spacer 400 may have a thickness of about 2,500 nm or more.

As described above, the light which is reflected by the first and second reflective electrodes 100 and 200 and is transmitted to the side is reflected toward the substrate 10 by the second reflective surface 202 of the second reflective electrode 200. The light reflected by the second reflective surface 202 passes through the spacer 400, the insulating layer 20, the opening 12, and the substrate 10, and is emitted to the outside.

The light emitted from the organic layer 300 is reflected by the first and second reflective electrodes 100 and 200 and is moved to the side as illustrated in FIG. 2, and as illustrated in FIG. 3, the light is reflected by the second reflective electrode 200 at the side and is emitted to the outside. Therefore, light confined by an optical waveguide is minimized.

However, as illustrated in FIG. 2, the light emitted from the organic layer 300 may be lost in a process where the light is reflected by the first and second reflective electrodes 100 and 200. Part of light incident on the first reflective electrode 100 or the second reflective electrode 200 is reflected, but the other light may be absorbed by the first and second reflective electrodes 100 and 200, particularly, a reflective layer 120 (see FIG. 4) which reflects light. As described above, the amount of light which is absorbed or dissipated in a reflection process may be changed or decrease depending on the number of times the light is reflected.

According to the above-described embodiment, in a structure where light is reflected and moved to a side, the amount of absorbed light increases due to repeated reflection. For this reason, emission efficiency is reduced.

In the present embodiment, at least one of the first and second reflective electrodes 100 and 200 may include a low refractive layer 130 having a refractive index of about 1.4 or less, for minimizing the amount of light which is absorbed in a process where the light is reflected by the first and second reflective electrodes 100 and 200. In embodiments, the low refractive layer may have a refractive index substantially smaller than that of an immediately neighboring layer, for example, the organic layer 300. In the illustrated embodiments, the low refractive layer may have a thickness substantially smaller than that of the organic layer 300.

Figure 4:
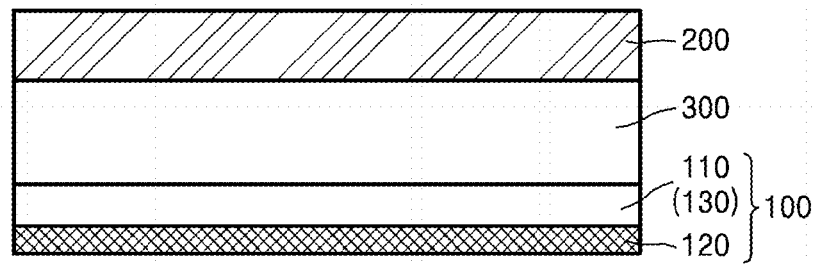
FIG. 4 is an enlarged diagram of a portion including a first reflective electrode in the organic light-emitting display apparatus according to an embodiment illustrated in FIG. 1.
Figure 5A:
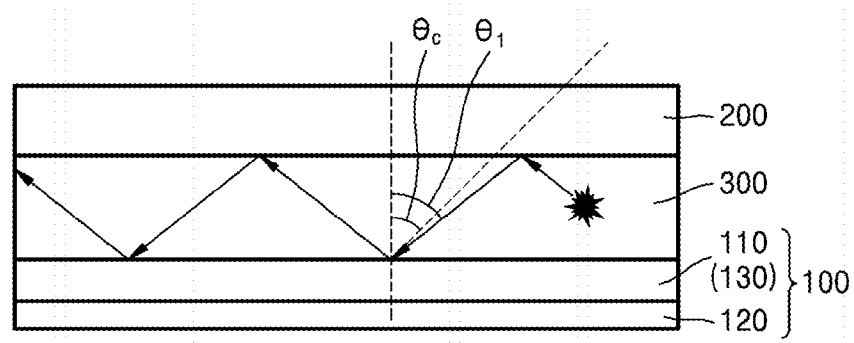
FIGS. 5A and 5B are diagrams for describing a movement of light based on an incident angle of light emitted from an organic layer of FIG. 4.
Figure 5B:
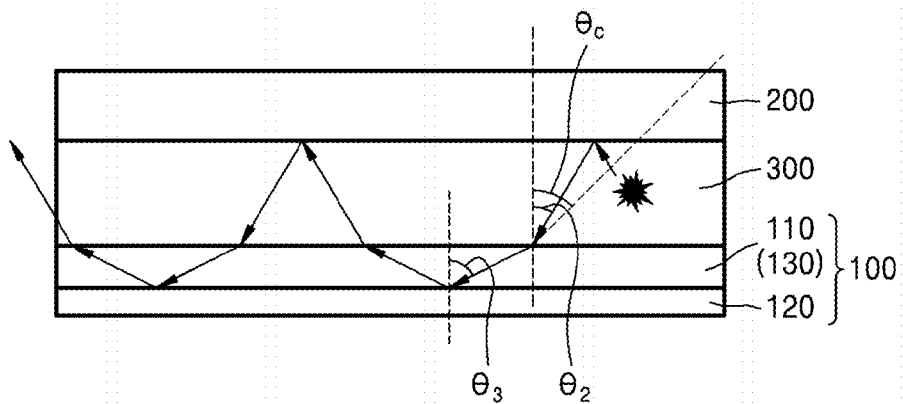

FIG. 4 is an enlarged diagram of a portion including the first reflective electrode 100 in the organic light-emitting display apparatus 1 according to an embodiment illustrated in FIG. 1, and FIGS. 5A and 5B are diagrams for describing a movement of light based on an incident angle of light emitted from the organic layer 300.

Referring to FIG. 4, the low refractive layer 130 having a refractive index of 1.4 or less may be included in the first reflective electrode 100. However, a disposition of the low refractive layer 130 is not limited to the first reflective electrode 100, and the low refractive layer 130 may be included in the second reflective electrode 200 or all the first and second reflective electrodes 100 and 200.

The first reflective electrode 100 may include a transparent electrode layer 110, contacting the organic layer 300, and a reflective layer 120 which is disposed under the transparent electrode layer 110.

The reflective layer 120 is a layer that reflects light passing through the transparent electrode layer 110, and may include a material selected from among metals, such as aluminum (Al), silver (Ag), platinum (Pt), gold (Au), chromium (Cr), tungsten (W), molybdenum (Mo), titanium (Ti), palladium (Pd), and iridium (Ir), and an alloy thereof. For example, the reflective layer 120 may include Ag.

The transparent electrode layer 110 is a layer that electrically contacts the organic layer 300, and may be an electrode for injecting holes into the organic layer 300. The transparent electrode layer 110 may be an anode. The transparent electrode layer 110 is a transparent layer through which light passes, and may have electrical conductivity.

The transparent electrode layer 110 may be the low refractive layer 130 having a refractive index of 1.4 or less. The transparent electrode layer 110 may have a refractive index less than that of the organic layer 300. For example, a refractive index difference between the transparent electrode layer 110 and the organic layer 300 may be 0.3 or more. When the refractive index of the organic layer 300 is about 1.7, a refractive index of the transparent electrode layer 110 may be about 1.2.

A critical angle "$\theta_c$" appears in a boundary between the organic layer 300 and the transparent electrode layer 110 due to a refractive index difference therebetween. Therefore, when the light emitted from the organic layer 300 moves to the first reflective electrode 100, absorption of the light by the reflective layer 120 is minimized.

The light emitted from the organic layer 130 may move to the transparent electrode layer 110 at various angles. For example, the light emitted from the organic layer 300 may be incident on the transparent electrode layer 110 at a greater angle than the critical angle "$\theta_c$", or may be incident at an angle less than the critical angle "$\theta_c$".

Referring to FIG. 5A, when an incident angle "$\theta_1$" at which the light emitted from the organic layer 300 is incident on the transparent electrode layer 110 is greater than the critical angle "$\theta_c$", the light emitted from the organic layer 300 is totally reflected to the transparent electrode layer 110. Therefore, the light emitted from the organic layer 300 is prevented from contacting the reflective layer 120.

Referring to FIG. 5B, when an incident angle "$\theta_a$" at which the light emitted from the organic layer 300 is incident on the transparent electrode layer 110 is less than the critical angle "$\theta_c$", the light is refracted, and thus, an incident angle "$\theta_3$" of the light incident on the reflective layer 120 is greater than the incident angle "$\theta_2$" of the light incident on the transparent electrode layer 110, thereby reducing the number of times the light is reflected by the reflective layer 120 at the same distance. Accordingly, the amount of light absorbed by the reflective layer 120 is reduced.

As described above, the amount of the light which is emitted from the organic layer 300 and is absorbed by the reflective layer 120 is reduced by using the transparent electrode layer 110 having a refractive index of 1.4 or less, thereby increasing the amount of light extracted to the outside.

The transparent electrode layer 110 having a refractive index of 1.4 or less may be a low refractive indium tin oxide (ITO) layer. The low refractive ITO layer may have a refractive index of 1.2 or less.

In the above-described embodiment, an example in which the transparent electrode layer 110 itself is the low refractive layer 130 has been described above. However, a disposition of the low refractive layer 130 is not limited thereto, and when the low refractive layer 130 is disposed on the reflective layer 120, the disposition of the low refractive layer 130 may be changed.

Figure 6:
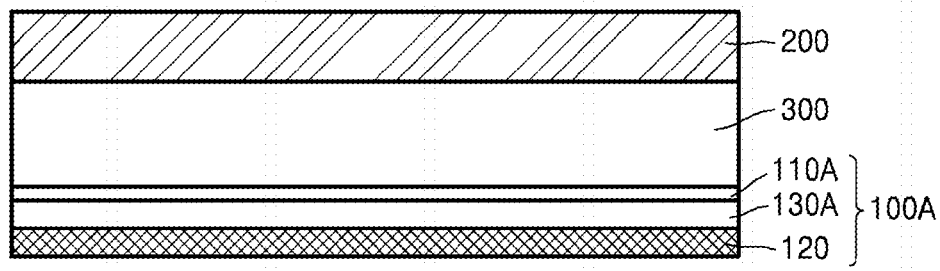
FIG. 6 illustrates a modification embodiment of FIG. 4, and is a diagram for describing an embodiment in which a disposition of a low refractive layer is changed.
Figure 7A:
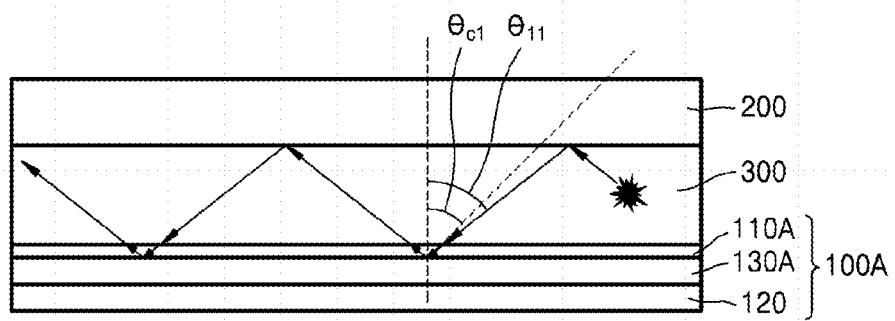
FIGS. 7A and 7B are diagrams for describing a movement of light based on an incident angle of light emitted from an organic layer of FIG. 6.
Figure 7B:
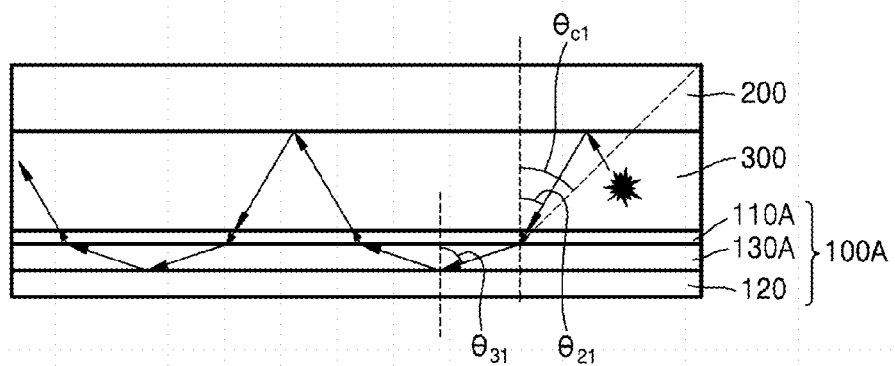

FIG. 6 illustrates a modification embodiment of FIG. 4, and is a diagram for describing an embodiment in which a disposition of a low refractive layer 130A is changed. FIGS. 7A and 7B are diagrams for describing a movement of light based on an incident angle of light emitted from the organic layer 300 of FIG. 6.

Referring to FIG. 6, a first reflective electrode 100A of the organic light-emitting display apparatus 1 includes a transparent electrode layer 110A, a low refractive layer 130A, and a reflective layer 120. Descriptions repetitive of elements which are the same as or similar to FIG. 4 are not provided, and a difference will be described.

The transparent electrode layer 110A may freely use a material which is used as a general transparent electrode. The transparent electrode layer 110A may be a layer including transparent conductive oxide, and for example, may be an ITO layer or an indium zinc oxide (IZO) layer. The transparent electrode layer 110A may have a refractive index similar to that of the organic layer 300. For example, a refractive index difference between the transparent electrode layer 110A and the organic layer 300 may be 0.1 or less. When the refractive index of the organic layer 300 is 1.7, the refractive index of the transparent electrode layer 110A may be 1.75. In embodiments, the transparent electrode layer 110A may have a refractive index substantially the same with or substantially greater than that of the organic layer 300A, but not limited thereto. In the illustrated embodiments, the transparent electrode layer 110A may have a thickness smaller than that of the low refractive layer 130A. The transparent electrode layer 110A may have a refractive index substantially greater than that of the low refractive layer 130A.

The low refractive layer 130A may have a refractive index of 1.4 or less. The low refractive layer 130A may be an SiO$_2$ layer having a refractive index of 1.4 or less. The refractive index of the low refractive layer 130A may be less than that of the transparent electrode layer 110A. The refractive index of the low refractive index 130A may be about 0.3 or more and may be less than that of the transparent electrode layer 110A.

A critical angle "$\theta_{c1}$" appears in a boundary between the transparent electrode layer 110A and the low refractive layer 130A due to a refractive index difference therebetween. Therefore, when the light emitted from the organic layer 300 moves to the first reflective electrode 100A, absorption of the light by the reflective layer 120 is minimized.

The light emitted from the organic layer 130 may pass through the transparent electrode layer 110A having a refractive index which is the same as or similar to that of the organic layer 130, and may be incident on the low refractive layer 130A at various angles. For example, the light emitted from the organic layer 300 may be incident on the low refractive layer 130A at a greater angle than the critical angle "$\theta_{c1}$", or may be incident at a less angle than the critical angle "$\theta_{c1}$".

Referring to FIG. 7A, when an incident angle "$\theta_{11}$" at which the light emitted from the organic layer 300 is incident on the low refractive layer 130A is greater than the critical angle "$\theta_{c1}$", the light emitted from the organic layer 300 is totally reflected to the low refractive layer 130A.

Therefore, the light emitted from the organic layer 300 is prevented from contacting the reflective layer 120.

Referring to FIG. 7B, when an incident angle "$\theta_{21}$" at which the light emitted from the organic layer 300 is incident on the low refractive layer 130A is less than the critical angle "$\theta_{c1}$", the light is refracted, and thus, an incident angle "$\theta_{31}$" of the light incident on the reflective layer 120 is greater than the incident angle "$\theta_{21}$" of the light incident on the low refractive layer 130A, thereby reducing the number of times the light is reflected by the reflective layer 120 at the same distance. Accordingly, the amount of light absorbed by the reflective layer 120 is reduced.

Figure 8A:
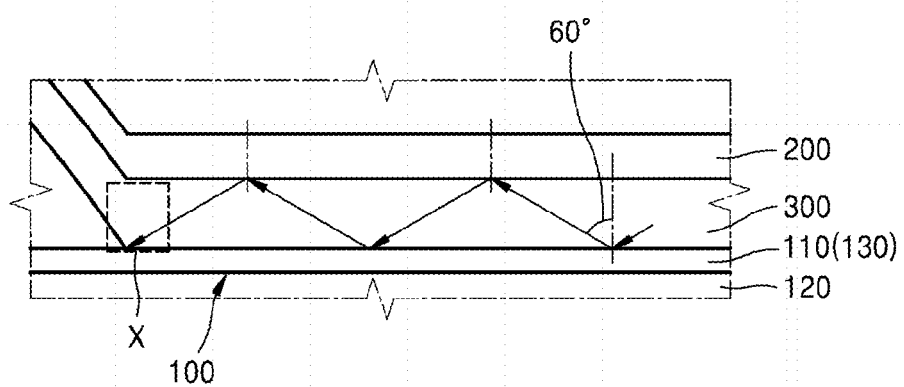
FIGS. 8A and 8B show simulation results of a trajectory and amount of light moving to a side when light emitted from an organic layer has an incident angle of 60 degrees and 45 degrees with respect to a first reflective electrode, in an organic light-emitting display apparatus according to an example.
Figure 8B:
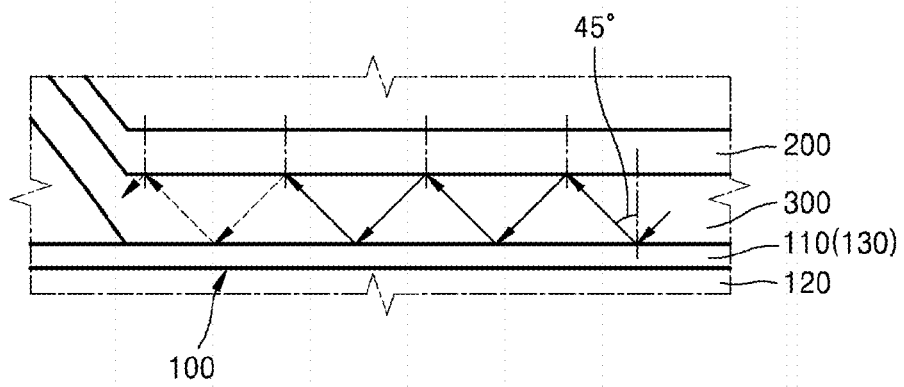
Figure 9A:
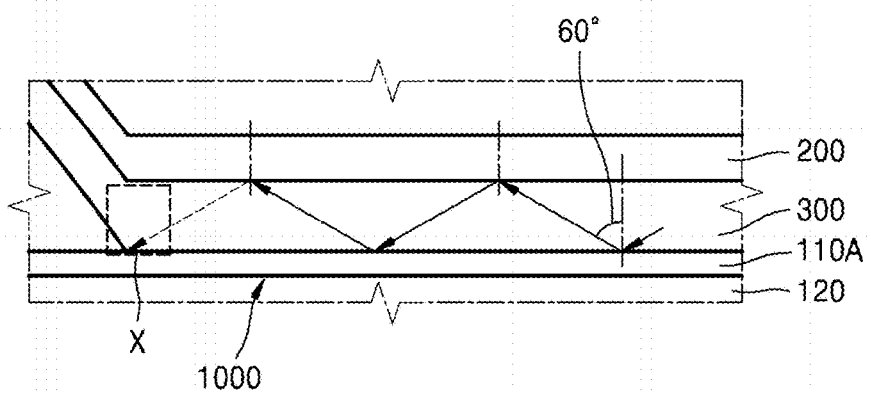
FIGS. 9A and 9B show simulation results of a trajectory and amount of light moving to a side when light emitted from an organic layer has an incident angle of 60 degrees and 45 degrees with respect to a first reflective electrode, in an organic light-emitting display apparatus according to a comparative example.
Figure 9B:
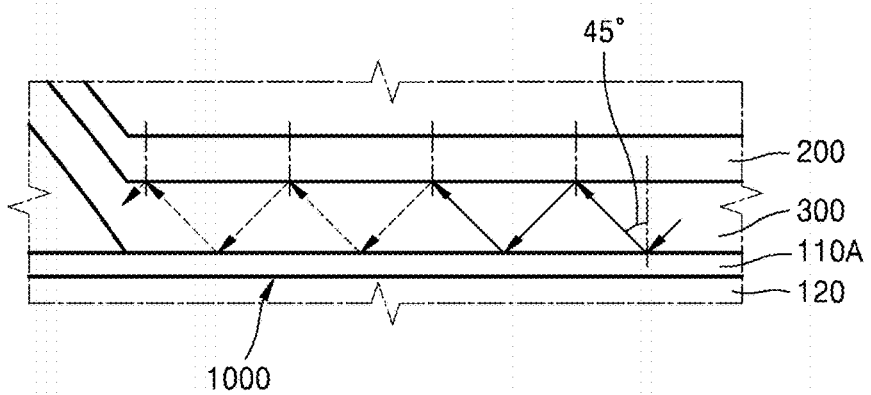

FIGS. 8A and 8B show simulation results of a trajectory and amount of light moving to a side when light emitted from the organic layer 300 has an incident angle of 60 degrees and 45 degrees with respect to the first reflective electrode 100, in the organic light-emitting display apparatus 1 according to an embodiment. FIGS. 9A and 9B show simulation results of a trajectory and amount of light moving to a side when light emitted from the organic layer 300 has an incident angle of 60 degrees and 45 degrees with respect to the first reflective electrode 100, in the organic light-emitting display apparatus 1 according to a comparative example.

FIGS. 8A and 8B show simulation results of an embodiment in which the first reflective electrode 100 includes the low refractive layer 130 having a refractive index of 1.4 or less, and FIGS. 9A and 9B show simulation results of a comparative example in which a first reflective electrode 1000 does not include the low refractive layer 130 having a refractive index of 1.4 or less. In the embodiment, the transparent electrode layer 110 is configured with a low refractive ITO layer having a refractive index of 1.2, and in the comparative example, a transparent electrode layer 110A is configured with an ITO layer having a refractive index of 1.75. Therefore, in the embodiment, a critical angle "$\theta_c$" which appears in a boundary between the organic layer 300 and the transparent electrode layer 110 is 41.8 degrees, and in the comparative example, a critical angle "$\theta_c$" which appears in a boundary between the organic layer 300 and the transparent electrode layer 110A is 76.5 degrees.

The light emitted from the organic layer 300 is alternately reflected by the first reflective electrode 100 and the second reflective electrode 200, and moves to the side. In a reflection process, the light is absorbed by the reflective layer 120, and thus, the amount of light is reduced. In the simulation results, when the amount of light is high, light is illustrated as a solid line arrow, and when the amount of light is low, light is illustrated as a dot line arrow.

In the embodiment and the comparative example, when light is incident on the first reflective electrode 100 at an incident angle of 60 degrees, comparing the amount of light, it may be seen in FIG. 8A that the light emitted from the organic layer 300 maintains a solid line arrow in a process where the light is reflected by the first and second reflective electrodes 100 and 200, and it may be seen in FIG. 9A that the light emitted from the organic layer 300 is changed from a solid line arrow to a dot line arrow in a process where the light is reflected by the first and second reflective electrodes 1000 and 200.

When the amount of the light emitted from the organic layer 300 is assumed as 1, the amount of light which is measured at a point X of FIG. 8A is 0.7384, and the amount of light which is measured at a point X of FIG. 9A is 0.7127. The amount of light shown in FIG. 8A is about 3.6% higher than the amount of light shown in FIG. 9A.

In the embodiment and the comparative example, even when light is incident on the first reflective electrodes 100 and 1000 at an incident angle of 45 degrees, the amount of light shown in the embodiment is maintained higher, than the amount of light shown in the comparative example. In FIG. 8A, the light emitted from the organic layer 300 maintains a solid line arrow until the light is reflected by the first reflective electrode 100 three times, and in FIG. 9A, the light emitted from the organic layer 300 maintains a solid line arrow until the light is reflected by the first reflective electrode 1000 twice. When the light emitted from the organic layer 300 is reflected by the first reflection electrodes 100 and 1000 the same times, it may be seen that the amount of dissipated light is lower in the embodiment, where the first reflective electrode 100 includes the low refractive layer 130, than the comparative example where the first reflective electrode 1000 does not include the low refractive layer 130.

Figure 10A:
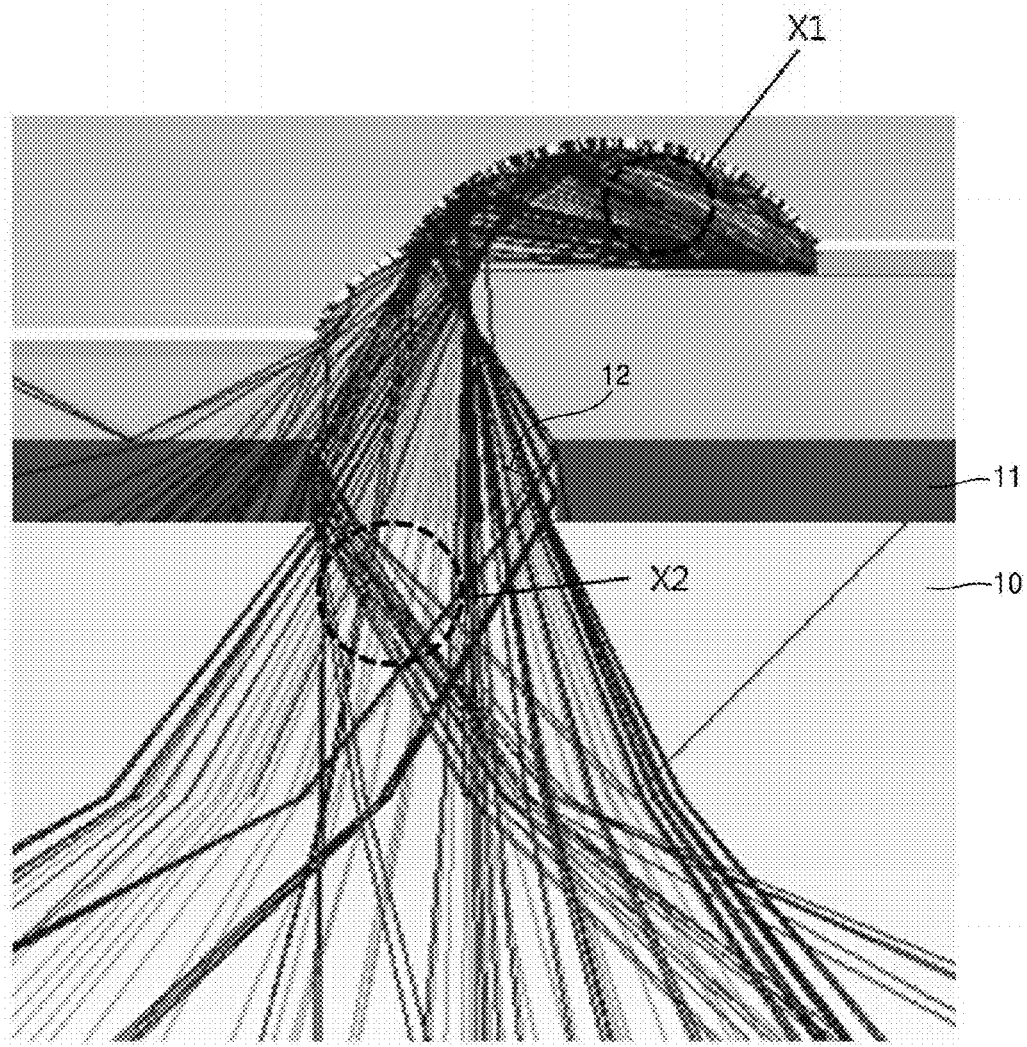
FIGS. 10A and 10B show simulation results of a trajectory and amount of light in an example, where a low refractive layer is included in a first reflective electrode, and a comparative example where the low refractive layer is not included in the first reflective electrode.
Figure 10B:
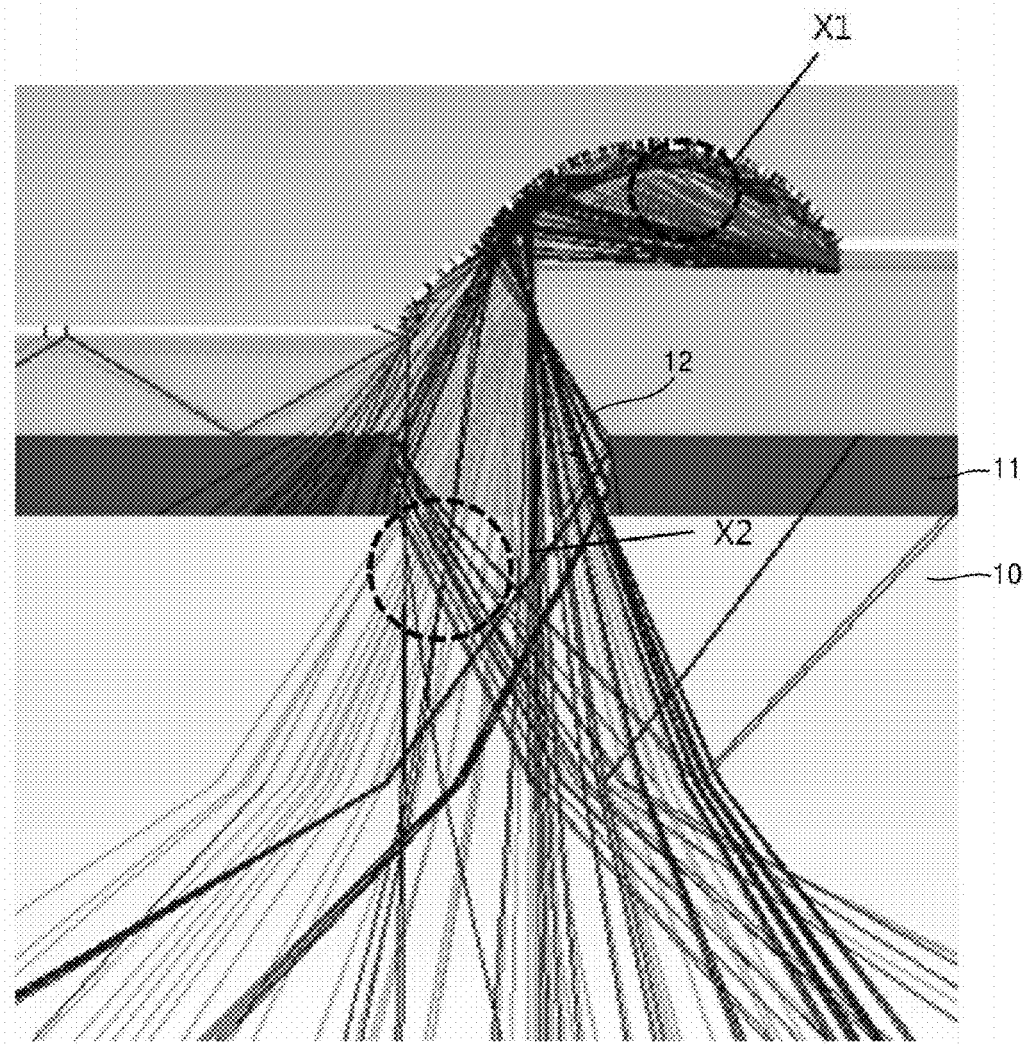

FIGS. 10A and 10B show simulation results of a trajectory and amount of light in an embodiment, where the low refractive layer 130 is included in the first reflective electrode 100, and a comparative example where the low refractive layer 130 is not included in the first reflective electrode 100.

A luminous flux density at which light is output through the opening 12 in an embodiment of FIG. 10A is higher than a luminous flux density at which light is output through the opening 12 in a comparative example of FIG. 10B. In detail, considering regions X1 and X2 in FIGS. 10A and 10B, it may be seen that a luminous flux density is higher in FIG. 10B than FIG. 10A. In a simulation result, a luminous flux density at which light is output in FIG. 10A is about 8.3% higher than a luminous flux density at which light is output in FIG. 10B.

Figure 11A:
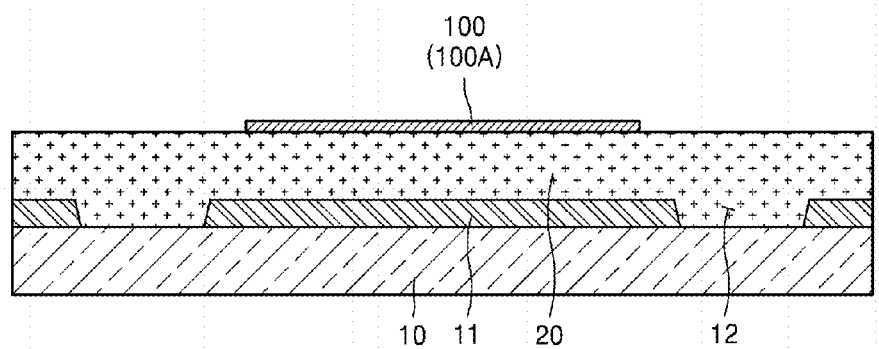
FIGS. 11A to 11C schematically illustrate a method of manufacturing an organic light-emitting display apparatus according to an embodiment.
Figure 11B:
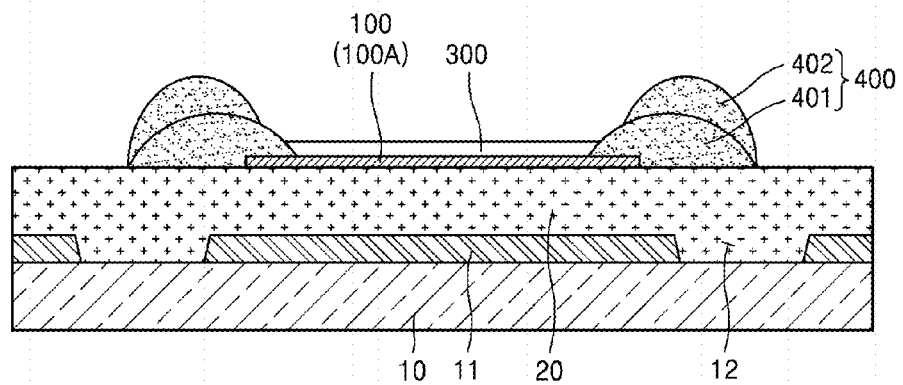
Figure 11C:
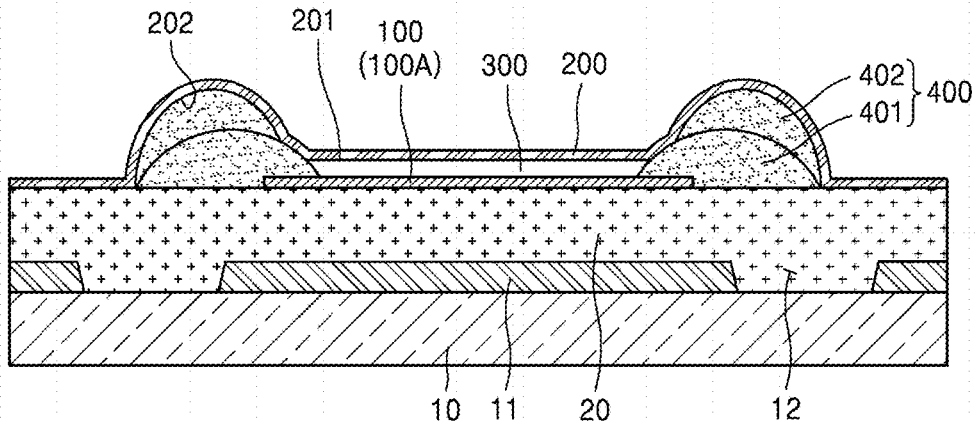

FIGS. 11A to 11C schematically illustrate a method of manufacturing the organic light-emitting display apparatus 1 according to an embodiment.

Referring to FIG. 11A, the first reflective electrode 100 (or 100A) is formed on the substrate 10. Before forming the first reflective electrode 100 (or 100A), the light blocking layer 11 and the insulating layer 20 covering the light blocking layer 11 may be formed on the substrate 10.

The substrate 10 may be a transparent substrate. For example, the substrate 10 may be a glass substrate, a quartz substrate, or a transparent resin substrate. The transparent resin substrate used as the substrate 10 may include a polyimide resin, an acryl resin, a polyacrylate resin, a polycarbonate resin, a polyether resin, a polyethylene terephthalate resin, or a sulfonic acid resin.

The insulating layer 20 may include an organic material. For example, the insulating layer 20 may include a material selected from among photoresist, an acryl-based polymer, a polyimide-based polymer, a polyamide-based polymer, a siloxane-based polymer, a polymer containing a photosensitivity acryl carboxyl group, a novolac resin, and an alkali soluble resin. The materials may be used as a single, or used in combination.

As another example, the insulating layer 20 may include an inorganic material. For example, the insulating layer 20 may include a silicon compound, metal, and metal oxide. The insulating layer 20 may include a material selected from among silicon oxide (SiOx), silicon nitride (SiNx), silicon oxynitride (SiOxNx), silicon oxycarbide (SiOxCy), silicon carbonitride (SiCxNy), aluminum (Al), magnesium (Mg), zinc (Zn), hafnium (Hf), zirconium (Zr), titanium (Ti), tantalum (Ta), aluminum oxide (AlOx), titanium oxide (TiOx), tantalum oxide (TaOx), magnesium oxide (MgOx), zinc oxide (ZnOx), hafnium oxide (HfOx), zirconium oxide (ZrOx), and titanium oxide (TiOx). The materials may be used as a single, or used in combination.

The first reflective electrode 100 (100A) may include a material suitable for performing a function of a reflective plate. For example, the first reflective electrode 100 (100A) may include a material selected from among metals, such as aluminum (Al), silver (Ag), platinum (Pt), gold (Au), chromium (Cr), tungsten (W), molybdenum (Mo), titanium (Ti), palladium (Pd), and iridium (Ir), and an alloy thereof. The first reflective electrode 100 (100A) may include a single-layer structure or a multi-layer structure including the above-described metals and/or alloy. A process of forming the first reflective electrode 100 (100A) will be described below.

Referring to FIG. 11B, the spacer 400 covering the end of the first reflective electrode 100 may be formed. The spacer 400 may be formed in a two-step structure. For example, the spacer 400 may include the first spacer portion 401 and the second spacer portion 402 which is formed on the first spacer portion 401.

The organic layer 300 may be formed on the first reflective electrode 100. The organic layer 300 is formed between the spacer 400 and the spacer 400.

The spacer 400 may be formed of an organic material. For example, the spacer 400 may include a material selected from photoresist, a polyacryl-based resin, a polyimide-based resin, and an acryl-based resin. However, a material of the spacer 400 is not limited thereto, and the spacer 400 may include an inorganic material, for example, a silicon compound.

The first and second spacer portions 401 and 402 may be formed of the same material or different materials.

The organic layer 300 may include an emission layer having at least one or more layers. The emission layer may be formed of, for example, various fluorescent or phosphor materials known to one of ordinary skill in the art.

The organic layer 300 may be formed in various structures which include the emission layer and further include various functional layers known to one of ordinary skill in the art. Examples of layers included in the organic layer 300 may include an electron injection layer, a hole blocking layer, an electron transport layer, a hole transport layer, and a hole injection layer.

Referring to FIG. 11C, the second reflective electrode 200 may be formed on the organic layer 300 and the spacer 400. The second reflective electrode 200 may be formed based on a shape of each of the organic layer 300 and the spacer 400. The second reflective electrode 200 may include the first reflective surface 201, which is formed based on the shape of the organic layer 300, and the second reflective surface 202 which is formed based on the shape of the spacer 400 surrounding the end of the first reflective electrode 100 (or 100A). The second reflective surface 202 may be disposed the end of the first reflective electrode 100, and may have an arc shape surrounding the end of the first reflective electrode 100.

The light emitted from the organic layer 300 may be reflected toward the substrate 10 by the second reflective surface 202. Therefore, light extracted to the side may be emitted toward the substrate 10.

Hereinafter, a process of forming the first reflective electrode 100 (or 100A) will be described in detail.

Figure 12A:
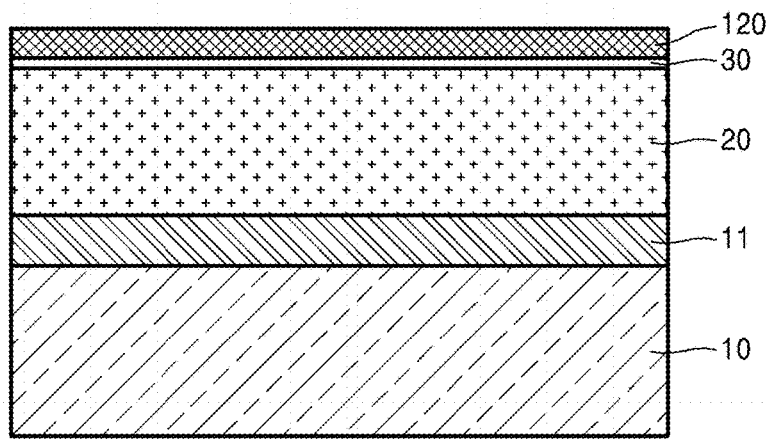
FIGS. 12A and 12B schematically illustrate an example of a process of forming the first reflective electrode disclosed in FIG. 4.
Figure 12B:
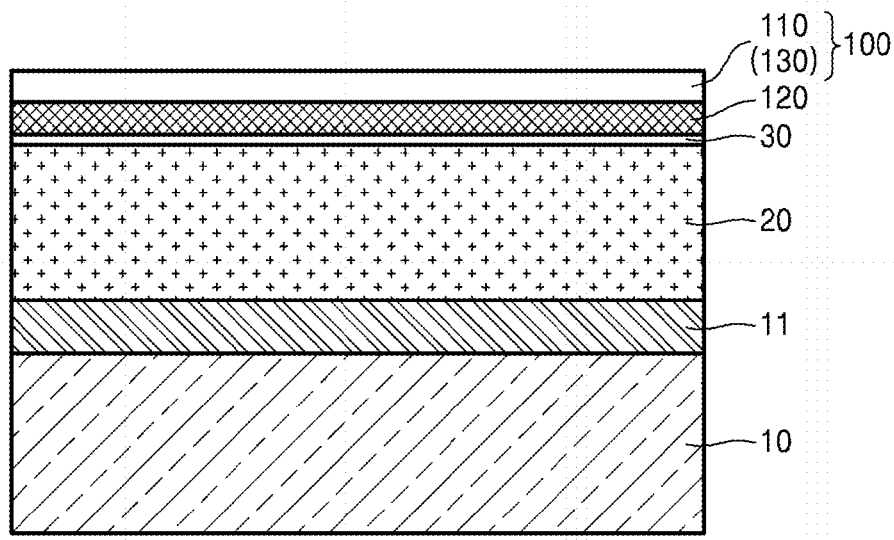
Figure 13:
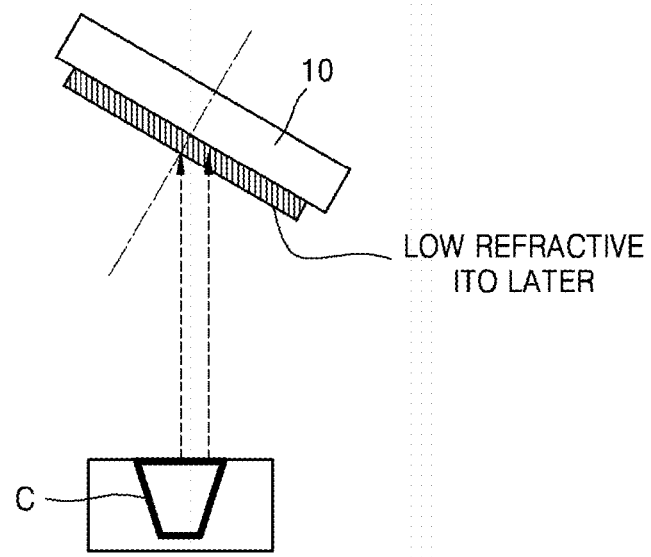
FIG. 13 is a diagram for describing a method of forming a low refractive indium tin oxide (ITO) layer.

FIGS. 12A and 12B schematically illustrate an example of a process of forming the first reflective electrode 100 disclosed in FIG. 4. FIG. 13 is a diagram for describing a method of forming a low refractive ITO layer.

Referring to FIG. 12A, the reflective layer 120 may be formed on the insulating layer 20. The reflective layer 120 may include a material selected from among metals, such as aluminum (Al), silver (Ag), platinum (Pt), gold (Au), chromium (Cr), tungsten (W), molybdenum (Mo), titanium (Ti), palladium (Pd), and iridium (Ir), and an alloy thereof. For example, the reflective layer 120 may include Ag.

Before forming the reflective layer 120, an intermediate layer 30 for enhancing an adhesive force of the reflective layer 120 and the insulating layer 20 may be formed on the insulating layer 20. A layer including transparent conductive oxide may be used as an example of the intermediate layer 30. For example, an ITO layer may be used as the intermediate layer 30. The intermediate layer 30 enhances the adhesive force of the reflective layer 120 and the insulating layer 20, and may act as a transparent electrode.

Referring to FIG. 12B, the transparent electrode layer 110 having a refractive index of 1.4 or less may be formed on the reflective layer 120. The transparent electrode layer 110 may be the low refractive layer 130 having a refractive index of 1.4 or less.

For example, the transparent electrode layer 110 may include a low refractive ITO layer having a refractive index of about 1.2 or less. An ITO layer may generally have a refractive index of about 1.7. A refractive index may be adjusted according to a forming method. For example, the low refractive ITO layer may be formed by using a glancing angle deposition process.

A method of forming a low refractive ITO layer will be described, referring FIG. 13. The substrate 10, on which a low refractive ITO layer is formed, is disposed to be inclined with respect to a spay angle of a crucible C. In this state, a deposition process is performed on the substrate 10. Through the deposition process, the low refractive ITO layer which is deposited to be inclined with respect to a direction vertical to the substrate 10 is formed on the substrate 10. Therefore, in generate deposition, a low refractive ITO layer having a refractive index of 1.2 or less may be formed of ITO, having a refractive index of about 1.7, on the substrate 10.

Figure 14A:
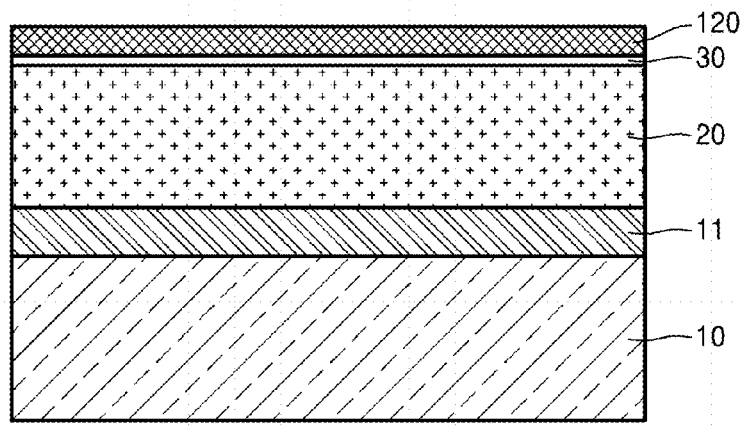
FIGS. 14A to 14C schematically illustrate another example of a process of forming a first reflective electrode disclosed in FIG. 6.
Figure 14B:
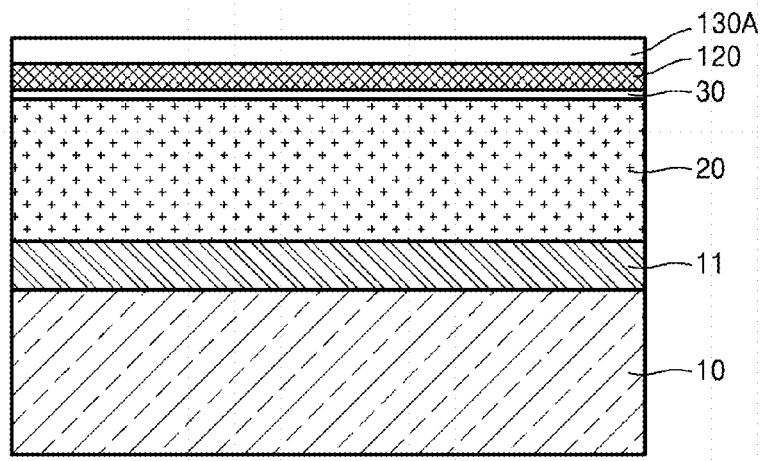
Figure 14C:
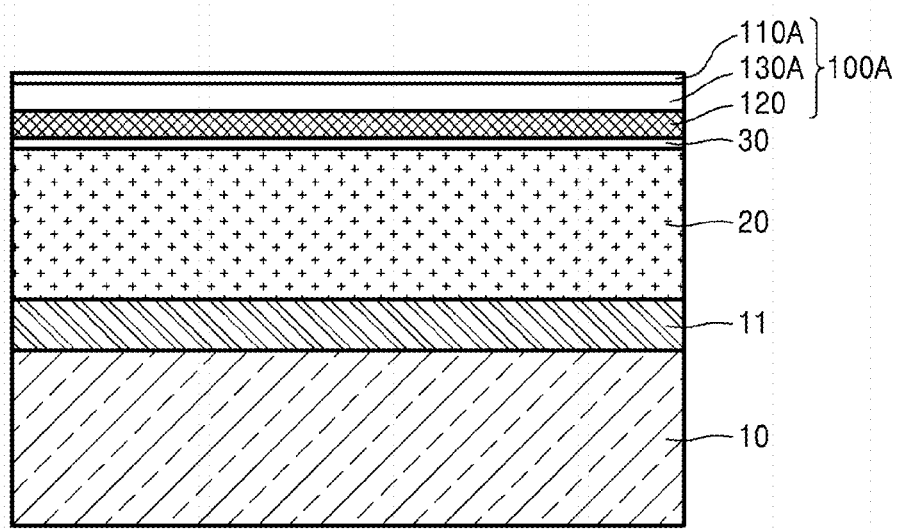

FIGS. 14A to 14C schematically illustrate another example of a process of forming the first reflective electrode 100A disclosed in FIG. 6.

Referring to FIG. 14A, the reflective layer 120 may be formed on the insulating layer 20. The reflective layer 120 may include a material selected from among metals, such as aluminum (Al), silver (Ag), platinum (Pt), gold (Au), chromium (Cr), tungsten (W), molybdenum (Mo), titanium (Ti), palladium (Pd), and iridium (Ir), and an alloy thereof. For example, the reflective layer 120 may include Ag.

Before forming the reflective layer 120, an intermediate layer 30 for enhancing an adhesive force of the reflective layer 120 and the insulating layer 20 may be formed on the insulating layer 20. A layer including transparent conductive oxide may be used as an example of the intermediate layer 30. For example, an ITO layer may be used as the intermediate layer 30. The intermediate layer 30 enhances the adhesive force of the reflective layer 120 and the insulating layer 20, and may act as a transparent electrode.

Referring to FIG. 14B, the low refractive layer 130A is formed on the reflective layer 120. The low refractive layer 130A may have a refractive index of 1.4 or less. For example, the low refractive layer 130A may be a $SiO_2$ layer having a refractive index of 1.4 or less.

Referring to FIG. 14C, the transparent electrode layer 110A is formed on the low refractive layer 130A. The transparent electrode layer 110A may have a refractive index which is the same as or similar to that of the organic layer 130. For example, the refractive index of the transparent electrode layer 110A may be 1.75, and the refractive index of the organic layer 300 may be 1.7. The transparent electrode layer 110A may be an ITO layer.

As described above, according to the one or more of the above embodiments, electrodes for injecting electrons and holes into an emission layer are formed as reflective electrodes, and a low refractive layer is formed in at least one of the electrodes, thereby enhancing light extraction efficiency.

It should be understood that the embodiments described therein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising:
    a substrate;
    a first reflective electrode disposed over the substrate;
    an organic layer disposed over the first reflective electrode, and comprising a light emission layer; and
    a second reflective electrode disposed over the organic layer,
    wherein at least one of the first and second reflective electrodes comprises a low refractive layer having a refractive index of about 1.4 or less, and
    the first reflective electrode includes a reflective layer configuring to reflect light emitted from the organic layer.

2. The organic light-emitting display apparatus of claim 1, wherein the first reflective electrode further comprises
    a transparent electrode layer contacting the organic layer and being substantially transparent,
    wherein the transparent electrode layer is interposed between the organic layer and the reflective layer.

3. The organic light-emitting display apparatus of claim 1, wherein the first reflective electrode comprises:
    the low refractive layer being substantially transparent and contacting the organic layer; and
    the reflective layer contacting the low refractive layer, wherein the low refractive layer is interposed between the organic layer and the reflective layer.

4. The organic light-emitting display apparatus of claim 1, wherein the low refractive layer is an indium tin oxide (ITO) layer having a refractive index of about 1.2 or less.

5. The organic light-emitting display apparatus of claim 1, wherein the low refractive layer is disposed between the transparent electrode layer and the reflective layer.

6. The organic light-emitting display apparatus of claim 5, wherein the low refractive layer is a $SiO_2$ layer having a refractive index of about 1.4 or less.

7. The organic light-emitting display apparatus of claim 5, wherein the transparent electrode layer has a refractive index substantially greater than that of the low refractive layer.

8. The organic light-emitting display apparatus of claim 1, further comprising a spacer disposed at a boundary of the first reflective electrode, and protruding in a direction away from the substrate.

9. The organic light-emitting display apparatus of claim 8, wherein the spacer comprises:
    a first spacer portion formed to cover the boundary of the first reflective electrode; and
    a second spacer portion formed on the first spacer.

10. The organic light-emitting display apparatus of claim 1, further comprising a spacer disposed over the substrate and next to the organic layer when viewed in a viewing direction perpendicular to a major surface of the substrate, wherein the spacer overlaps a boundary of the first reflective electrode when viewed in the viewing direction.

11. The organic light-emitting display apparatus of claim 1, wherein the second reflective electrode comprises:
    a first reflective surface configured to reflect light emitted from the organic layer toward the first reflective electrode; and
    a second reflective surface disposed next to the first reflective surface when viewed in a viewing direction perpendicular to a major surface of the substrate, and configured to reflect the light emitted from the organic layer toward the substrate.

12. The organic light-emitting display apparatus of claim 11, wherein the second reflective surface overlaps a boundary of the first reflective electrode when viewed in the viewing direction, and has an arc shape in a section perpendicular to the major surface of the substrate.

13. The organic light-emitting display apparatus of claim 1, further comprising an insulating layer disposed between the substrate and the first reflective electrode.

14. The organic light-emitting display apparatus of claim 1, wherein the substrate is substantially transparent.

15. The organic light-emitting display apparatus of claim 14, further comprising a light blocking layer disposed between the substrate and the first reflective electrode and overlapping the first reflective electrode when viewed in a viewing direction perpendicular to a major surface of the substrate.

16. The organic light-emitting display apparatus of claim 1, wherein the low refractive layer is interposed between the organic layer and the reflective layer, wherein the organic layer has a refractive index substantially greater than that of the low refractive layer.

17. A method of making an organic light-emitting display apparatus, the method comprising:
    forming a first reflective electrode over a substrate;
    forming an organic layer comprising a light emission layer over the first reflective electrode; and
    forming a second reflective electrode over the organic layer,
    wherein at least one of the first reflective electrode and the second reflective electrode comprises a low refractive layer having a refractive index of about 1.4 or less, and
    the first reflective electrode includes a reflective layer configured to reflect light emitted from the organic layer.

18. The method of claim 17, wherein the first reflective electrode further comprises:
    the low refractive layer being substantially transparent, disposed between the reflective layer and the organic layer and having a refractive index of about 1.2 or less.

19. The method of claim 17, wherein the first reflective electrode further comprises:
    the low refractive layer; and
    a transparent electrode layer disposed between the organic layer and the low refractive layer.

20. The method of claim 17, wherein the organic layer has a refractive index substantially greater than that of the low refractive layer.

* * * * *